United States Patent
Cook et al.

(10) Patent No.: US 10,032,850 B2
(45) Date of Patent: Jul. 24, 2018

(54) SEMICONDUCTOR DIE WITH BACK-SIDE INTEGRATED INDUCTIVE COMPONENT

(71) Applicant: Texas Instruments Incorporated, Dallas, TX (US)

(72) Inventors: Benjamin Stassen Cook, Addison, TX (US); Roberto Giampiero Massolini, Pavia (IT); Daniel Carothers, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/152,518

(22) Filed: May 11, 2016

(65) Prior Publication Data
US 2017/0330930 A1    Nov. 16, 2017

(51) Int. Cl.
| | | |
|---|---|---|
| H01L 21/00 | (2006.01) | |
| H01L 49/02 | (2006.01) | |
| H01L 21/3065 | (2006.01) | |
| H01L 21/768 | (2006.01) | |
| H01L 23/495 | (2006.01) | |
| H01L 23/498 | (2006.01) | |

(52) U.S. Cl.
CPC ........ *H01L 28/10* (2013.01); *H01L 21/30655* (2013.01); *H01L 21/76877* (2013.01); *H01L 23/49541* (2013.01); *H01L 23/49811* (2013.01); *H01L 23/49827* (2013.01)

(58) Field of Classification Search
CPC ............... H01L 28/10; H01L 23/49827; H01L 23/49541; H01L 23/49811
See application file for complete search history.

(56) References Cited

U.S. PATENT DOCUMENTS

| | | | | |
|---|---|---|---|---|
| 7,436,281 | B2 * | 10/2008 | Brennan | H01F 17/0006 336/200 |
| 8,299,572 | B2 | 10/2012 | Reisner | |
| 8,664,752 | B2 | 3/2014 | Jeon et al. | |
| 2003/0057539 | A1 | 3/2003 | Koopmans | |
| 2005/0023639 | A1 | 2/2005 | Yeh et al. | |
| 2005/0176215 | A1 * | 8/2005 | Jeong | H01L 21/764 438/427 |
| 2008/0020488 | A1 | 1/2008 | Clevenger et al. | |
| 2009/0283854 | A1 * | 11/2009 | Levy | H01L 27/1203 257/531 |
| 2012/0068301 | A1 | 3/2012 | Sin et al. | |
| 2016/0149122 | A1 * | 5/2016 | Sullivan | H01L 23/5227 438/3 |

(Continued)

OTHER PUBLICATIONS

"3D Printing", Wikipedia, available at http://en.wikipedia.org/w/index.php?title=3D_printing&oldid=624190184, Sep. 4, 2014, pp. 1-35.

(Continued)

*Primary Examiner* — Laura Menz
(74) *Attorney, Agent, or Firm* — Michael A. Davis, Jr.; Charles A. Brill; Frank D. Cimino

(57) ABSTRACT

An integrated circuit (IC) that includes a circuit substrate having a front side surface and an opposite back side surface. Active circuitry is located on the front side surface. An inductive structure is located within a deep trench formed in the circuit substrate below the backside surface. The inductive structure is coupled to the active circuitry.

14 Claims, 11 Drawing Sheets

(56) References Cited

U.S. PATENT DOCUMENTS

2017/0125317 A1* 5/2017 Kuo .................... H01L 23/315

OTHER PUBLICATIONS

"Deep Reactive-Ion Etching", Wikipedia, available at https://en.wikipedia.org/wiki/Deep_reactive-ion_etching on Apr. 13, 2016, pp. 1-2.
"The Bosch Process for Etching Micro-Mechanical Systems (MEMS)—Principles, Advances and Applications by Oxford Instruments Plasma Technology", AZoNanoThe A to Z of Nanotechnology, Nov. 26, 2010, pp. 1-14.
International Search Report for corresponding PCT Application No. PCT/US2017/032247, dated Aug. 17, 2017 (3 pages).

* cited by examiner

SEMICONDUCTOR DIE WITH BACK-SIDE INTEGRATED INDUCTIVE COMPONENT

FIELD OF THE INVENTION

This disclosure relates to fabrication of integrated circuits, and in particular to the fabrication of an inductive component on the backside of a semiconductor die.

BACKGROUND OF THE INVENTION

Occasionally, a circuit that is implemented within an integrated circuit (IC) requires an inductive component. An inductive component may be fabricated by forming a coil on one or more of the metal layers of the IC; however, the inductance of such a component is limited to a relatively low value. However, the quality factor of in inductor formed in the metal layers of the IC may be limited given the very high resistance per square of a typical metal layer. Typically, such an inductor may only be useful for ultra high frequency (UHF) circuits, such as 300 MHz-3 GHz frequency range. Furthermore, they may contribute to significant switching losses.

Currently, silicon IC's such as switch-mode DC-DC converters use co-packaged discrete inductors which are large and bulky, contribute to package complexity, and may be a large percentage of the package cost.

BRIEF DESCRIPTION OF THE DRAWINGS

Particular embodiments in accordance with the invention will now be described, by way of example only, and with reference to the accompanying drawings.

Figure 1:
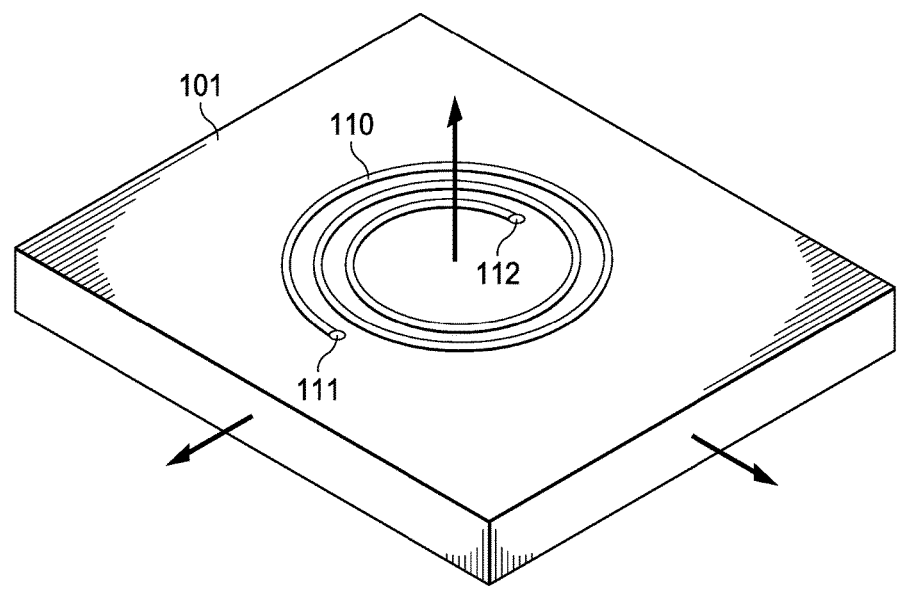
FIG. 1 is an illustration of an exemplary inductor fabricated on the backside of an IC.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A wide portfolio of silicon IC's require inductors which cannot be integrated within the metal stack due to the limited size, current capability, and efficiency obtainable within metal layer integrated inductors. Functions that may require inductors that cannot be implemented within the metal layers of the IC may include: filter output voltage and current; store energy that is delivered cycle by cycle; provide an efficient way to move energy from two or more voltage domains; perform auxiliary functions such as providing adiabatic gate drivers and zero voltage transitions; etc.

A majority of ICs are fabricated on a silicon substrate in which a large portion of the silicon substrate is typically needed only to mechanically support the active devices that are created on the surface of the silicon substrate. A method will now be disclosed in which an inductor, or two or more coupled inductors, may be formed within the unused bulk silicon substrate. Embodiments of the disclosure may be used to implement various functions, such as those mentioned above.

FIG. 1 is an illustration of an exemplary spiral inductor 110 fabricated on the backside of a circuit substrate 101. In this example, inductor 110 has on outside endpoint 111 and in inside endpoint 112. In this example, substrate 101 is a silicon die that forms an integrated circuit and includes active circuitry that is formed on the other side of substrate 101. Embodiments of this disclosure may incorporate an inductor into the un-used die silicon by etching a trench into the back side of the silicon, and using the etched trench area to implement a high density, high quality factor (Q) inductor. Quality factor Q is a measure of the efficiency of an inductor; a high Q inductor indicates the inductor will be an efficient, low loss inductor.

Embodiments of this disclosure intrinsically integrate inductor 110 into silicon substrate 101. This means that by three dimensional (3D) post processing on the silicon wafer, it will be possible to have a co-packaged solution without the need for complex and expensive packaging technology, such as chip-on-die, SIP, etc. . . . .

Embodiments of this disclosure may be smaller in size than other known solutions. Rather than having the silicon IC and an inductor placed side by side, it will enable "vertical" integration which saves total solution silicon area.

Previous solutions may have included a laminate air core inductor or a fiberglass printed circuit board (PCB), such as grade FR4 PCB material. Another previous solution may have included a closed core chip inductor. Unfortunately, closed core inductors suffer from core saturation. Therefore, an application in which very large peak current are needed may not be viable with a closed core inductor.

Embodiments of this disclosure may benefit by having much taller copper traces to provide lower DCR (direct current resistance) for the same inductance, and thereby high Q. The tall copper traces may allow very large peak currents for applications that require large peak currents. Tall copper traces may also improve ACR (alternating current resistance) by providing a better configuration for proximity effects.

As will be described in detail below, a process for forming an inductor in trenches in the bulk silicon substrate may be an inexpensive process.

Figure 2:
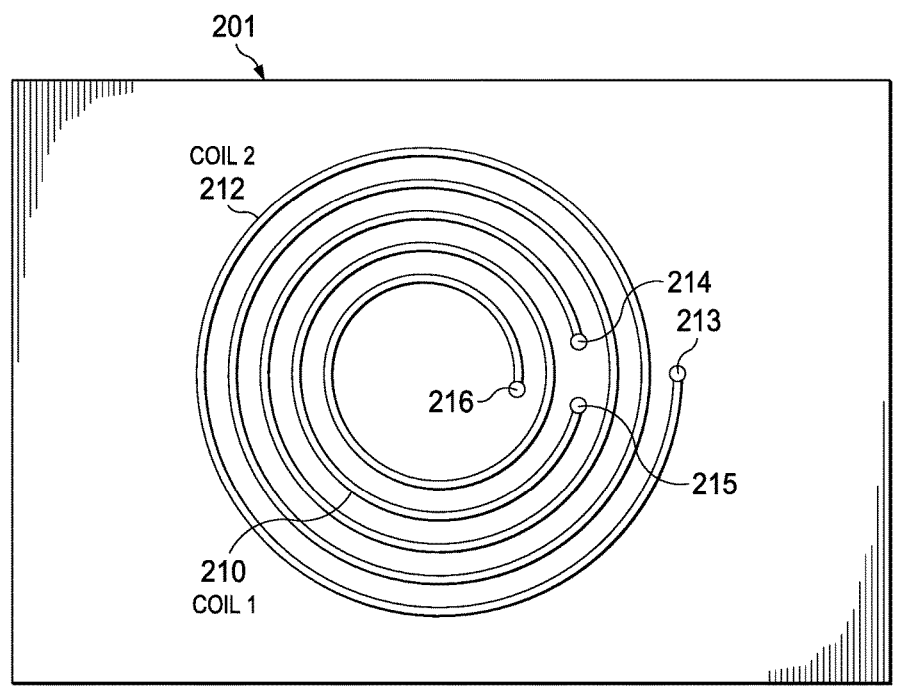
FIG. 2 is an illustration of exemplary coupled inductors fabricated on the backside of an IC.

FIG. 2 is an illustration of exemplary coupled inductors fabricated on the backside of an IC substrate 201. In this example, a first spiral coil 210 surrounds a second spiral coil 212. This configuration allows a magnetic field produced by one of the coils to couple with and produce a current in the other coil. Coil 210 has endpoints 213, 214 and coil 212 has endpoints 215, 216. Various ways of coupling contact points at the coil endpoints to active circuitry on the other side of the circuit substrate will be disclosed below.

In another embodiment, the two coils may be interleaved for improved coupling.

In another embodiment, a first coil may be formed in a first layer of the substrate, and then a second substrate layer may be formed on the first substrate layer and a second coil may then be formed in trenches in the second layer of the substrate, as will be explained in more detail below.

While circular spiral coils are illustrated in FIGS. 1 and 2, other embodiments may use other shapes, such as oval, rectangular, etc.

Figure 3:
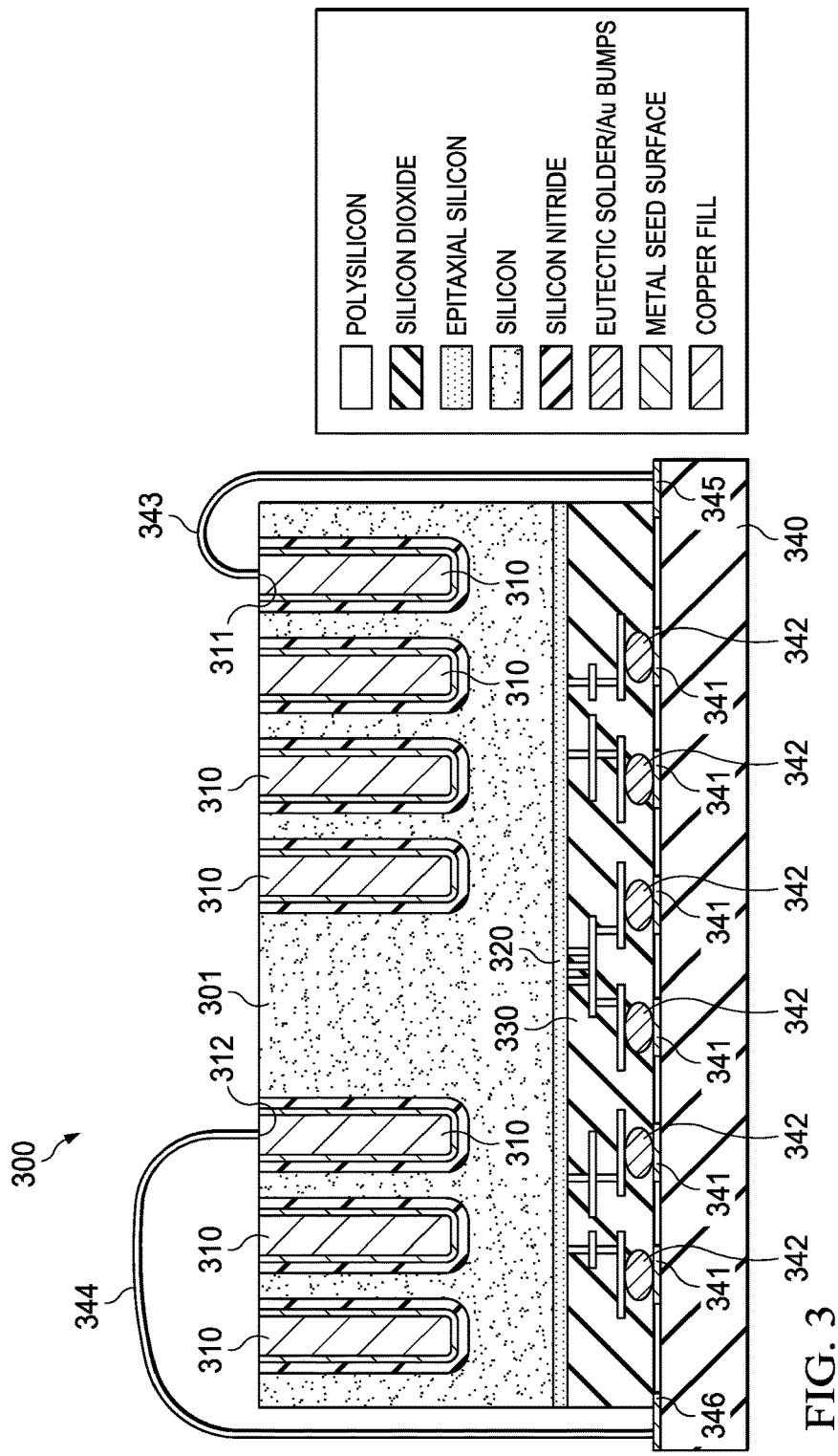
FIGS. 3-5 illustrate various ways of connecting a back-side inductor to active circuitry of the IC.

FIG. 3 is a cross-section view of exemplary IC 300 illustrating a way of connecting a backside inductor 310 to active circuitry of IC 300. IC 300 includes a bulk silicon substrate 301 in which inductor 310 is formed in trenches, as will be described in more detail later.

An epitaxial (epi) silicon layer 320 may be formed on one side of substrate 301. A thick epi layer may be beneficial for power semiconductors and MEMS-based sensors and actuators. "Thick" is a relative term, of course. Today, epi films of more than 20 μm are regarded as thick, although developmental targets for films can be as much as ~150 μm in thickness. The electrical isolating qualities of the undoped thick epi films may provide a benefit for power semiconductors. They enable higher voltages with larger R(off) values, and contribute to higher switching speeds and reduced device footprints. Various transistors may be formed in epi layer 320 using known fabrication techniques which need not be described herein.

Multiple layers of metal, such as copper, may then be formed between insulating layers such as silicon dioxide using known or later developed processes to form a multilayer interconnect 330 that connects with the various transistors to form an active circuit.

In this example, IC 300 is fabricated as a "flip chip". Flip chip is a method for interconnecting semiconductor devices, such as IC chips and micro-electromechanical systems (MEMS), to external circuitry with solder bumps 342, for example, that have been deposited onto the chip pads. The solder bumps may be deposited on the chip pads on the top side of the wafer during the final wafer processing step. In order to mount the chip to package substrate 340 (e.g., a lead frame, a circuit board or another chip or wafer), it is flipped over so that its top side faces down, and aligned so that its pads align with matching pads 341 on the external circuit or leadframe 340, and then the solder is reflowed to complete the interconnect. This is in contrast to wire bonding, in which the chip is mounted upright and wires are used to interconnect the chip pads to external circuitry or lead frame.

Processing a flip chip is similar to conventional IC fabrication, with a few additional steps. Near the end of the manufacturing process, the attachment pads are metalized to make them more receptive to solder. This typically consists of several treatments. More recently, a process is used in which metal posts are formed on each metalized attachment pat to extend the height of the contact. A small dot of solder may then deposited on each metalized pad. Alternatively, the solder dots may be placed on the leadframe. The chips are then cut out of the wafer as normal.

To attach the flip chip into a circuit, the chip is inverted to bring the solder dots down onto connectors on the underlying leadframe or circuit board. The solder is then re-melted to produce an electrical connection, typically using a Thermosonic bonding or alternatively a reflow solder process.

In this embodiment, a wire bonding process may be used to couple inductive coil 310 to the active circuitry in the epi layer 320 of IC 300. In this example, wire bond 343 couples an outside end point 311 of coil 310 to contact pad 345 on package substrate 340. Similarly, wire bond 344 couples an inside end point 312 of coil 310 to contact pad 346 on package substrate 340. Copper or other types of metal, traces may then couple contact pads 345, 346 to other contact pads 341 and thereby to active circuitry within epi layer 320.

In another embodiment, bonding clips may be used to couple inductive coil 310 to the active circuitry in the epi layer 320 of IC 300, for example. Bonding clips are larger than bond wires and provide much larger current carrying capacity.

Figure 4:
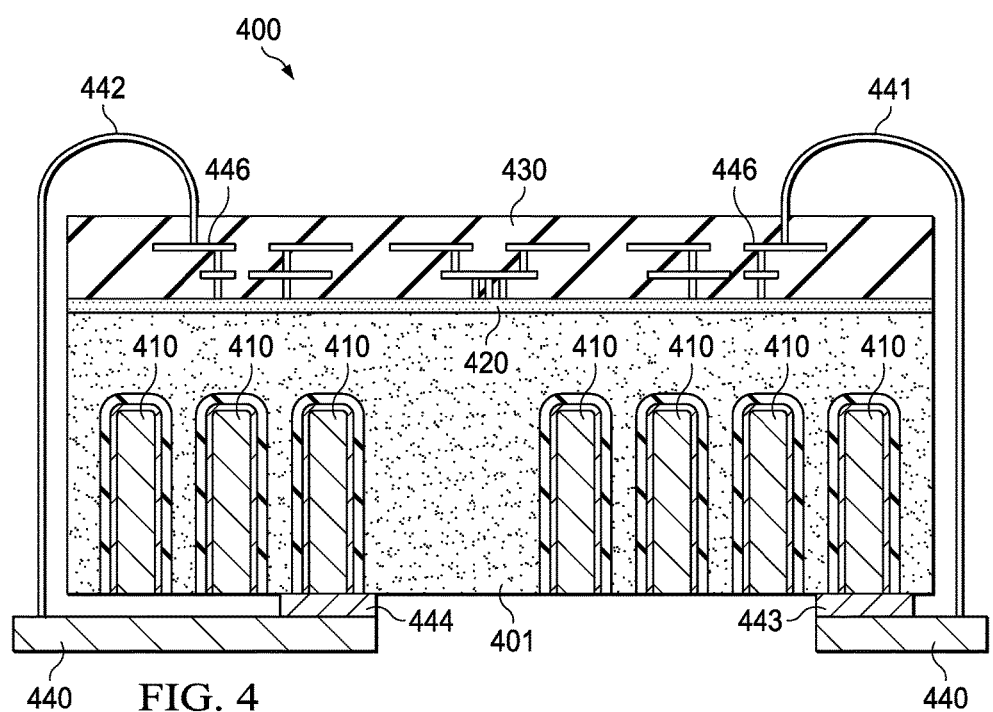

FIG. 4 is a cross-section view of exemplary IC 400 illustrating another way of connecting a backside inductor 410 to active circuitry of IC 400. IC 400 includes a bulk silicon substrate 401 in which inductor 410 is formed in trenches, as will be described in more detail later.

As described in more detail above, epi layer 420 may be formed on one surface of bulk substrate 401. Various transistors may be fabricated in epi layer 420 to form active circuitry that is interconnected by a multilayer interconnect 430.

In this example, the silicon die is mounted upright on a package substrate 440 that may be a lead frame or other type of substrate such as a circuit board, for example. Solder bump 443 may be used to couple an outside end of coil 410 to a pad on substrate 440. Similarly, solder bump 444 may be used to couple an inside end of coil 410 to a pad on substrate 440.

Wire bonds 441, 441 may then couple from leads on substrate 440 to pads 446 on interconnect layer 430 and thereby to transistors with epi layer 420. Similarly, additional wire bonds (not shown) may couple from other pads in interconnect layer 530 to substrate 440 in order to route other signals to/from the active circuitry in epi layer 420.

Figure 5:
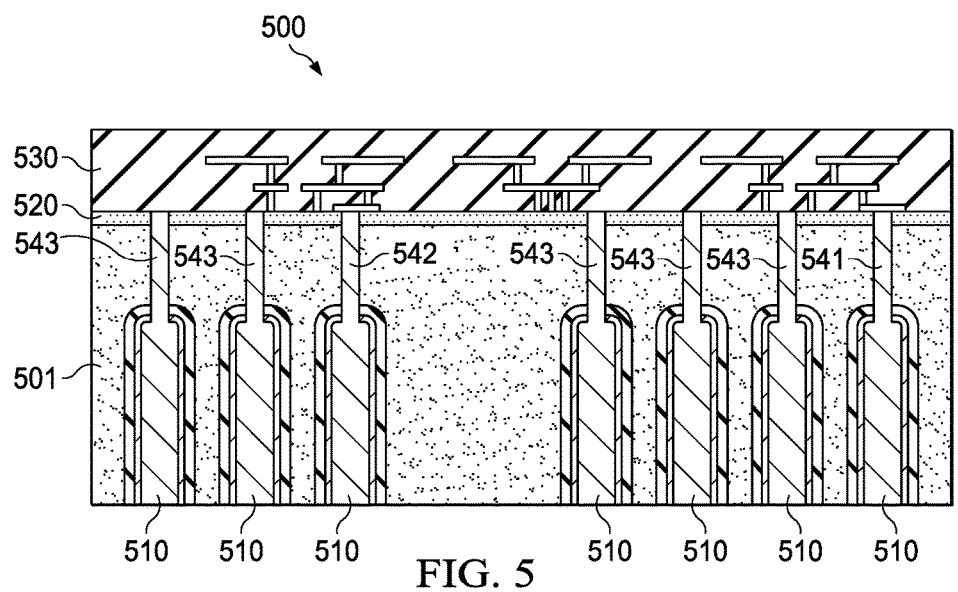

FIG. 5 is a cross-section view of exemplary IC 500 illustrating another way of connecting a backside inductor 510 to active circuitry of IC 500. IC 500 includes a bulk silicon substrate 501 in which inductor 510 is formed in trenches, as will be described in more detail later.

As described in more detail above, epi layer 520 may be formed on one surface of bulk substrate 501. Various transistors may be fabricated in epi layer 520 to form active circuitry that is interconnected by a multilayer interconnect 530.

In this example, "through silicon vias" (TSV) are used to interconnect the backside inductor 510 with active circuitry in epi layer 520. For example, TSV 541 may be used to couple an outside end of coil 510 to a pad in interconnect layer 530 and thereby to active circuitry in epi layer 530. Similarly, TSV 542 may be used to couple an inside end of coil 510 to a pad in interconnect layer 530 and thereby to active circuitry in epi layer 530.

In some embodiments, additional TSVs, such as any of TSVs 543 may be used to connect additional contact points on the various loops of inductor 510 to active circuitry in epi layer 530. This may allow configuring the coil for various needs using switch transistors, for example. Various implementations may include: tuning of the coil by enabling fewer or more turns, configuring turns in parallel, etc.

In some embodiments, IC 500 may be packaged using flip chip technology to complete the remaining connections between the active circuitry in epi layer 520 and the lead frame or substrate, similar to FIG. 3. In other embodiments, IC 500 may be mounted on a leadframe or substrate in a conventional top up configuration in which bond wires may be used to complete the remaining connections between the active circuitry in epi layer 520 and the leadframe or substrate, similar to FIG. 4. Other embodiments may use other known or later developed packaging and interconnect technology to interconnect to IC 500 while TSVs are used to connect one or more backside coils to active circuitry on the front surface of the substrate.

FIGS. 6A-6G are cross-sectional views of a portion of a silicon wafer 601 illustrating a method for forming an inductive component on the backside of an IC, as disclosed above. The method may be performed to the back side of a silicon wafer after the front side has been processed to fabricate an array of integrated circuits. Alternatively, the backside inductive components may be formed first and then the active circuitry may be fabricated on the front surface of the silicon wafer.

The process for fabricating semiconductor circuitry on a silicon wafer is well known and need not be described herein. Typically, hundreds of IC dies are fabricated on a single silicon wafer. The completed circuits may then be tested using test probes to activate on monitor the individual circuit die. The wafer may then be cut into individual dies, attached to a leadframe or other substrate, packaged and final tested using known or later developed processes.

Figure 6A:
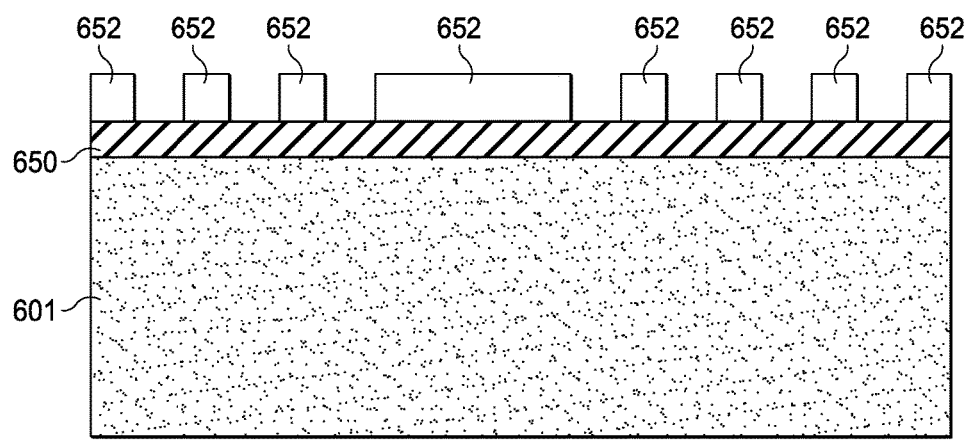
FIGS. 6A-6G illustrate a method for forming an inductive component on the backside of an IC.

FIGS. 6A-6F illustrate only the backside of a silicon wafer 601. Circuitry on the front side is not shown for simplicity, or may not be there yet. FIG. 6A illustrates a portion of a silicon wafer 601 that forms a substrate. A layer 650 of silicon dioxide is deposited on the back surface of substrate 601. A resist layer 652 is applied over silicon dioxide layer 650 and may be patterned using known or later developed photolithography process to form a mask for the next step of deep silicon etch. The mask may be patterned to form a spiral or other shape trench, or multiple spirals for one or more backside inductors, as illustrated in FIGS. 1 and 2, for example.

Figure 6B:
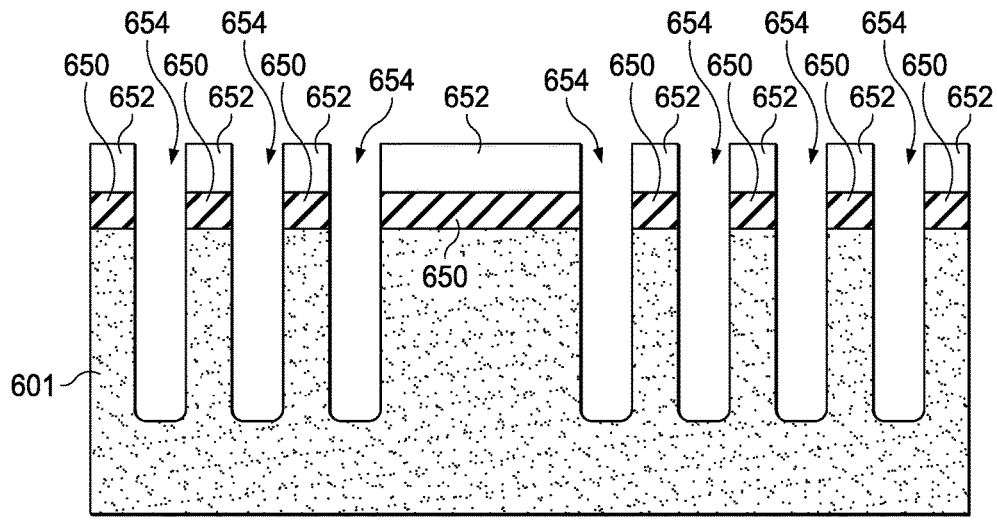

FIG. 6B illustrates an exemplary trench that may be formed in the bulk silicon of substrate 601 using one of several process, such as a deep reactive ion etch, or a Bosch silicon etch, for example. Initially, a chemical etch of the hard mask layer 650 may be performed using photo mask layer 652. The Bosch process, named after the German company Robert Bosch GmbH, is also known as pulsed or time-multiplexed etching. The Bosch process alternates repeatedly between two modes to achieve nearly vertical structures. The first mode is a standard nearly isotropic plasma etch. The plasma contains ions which attack the wafer from a nearly vertical direction. Sulfur hexafluoride [SF6] is often used for silicon. The second mode is deposition of a chemically inert passivation layer. For instance, C4F8 (Octafluorocyclobutane) gas yields a substance similar to Teflon.

Each phase lasts for several seconds. The hard mask 650 on the surface and the passivation layer on the sides of the trench protects the entire substrate from further chemical attack and prevents further etching. However, during the etching phase, the directional ions that bombard the substrate attack the passivation layer at the bottom of the trench, while leaving the sides generally unaffected. The ions collide with the passivation layer at the bottom of the trench and sputter it off, exposing the substrate at the bottom of the trench to the chemical etchant. These etch/deposit steps are repeated many times resulting in a large number of very small isotropic etch steps taking place only at the bottom of the etched pits. To etch a 500 um deep trench in a silicon wafer, for example, 100-1000 etch/deposit steps may be needed. The two-phase process may cause the sidewalls to undulate with an amplitude of about 100-500 nm, for example. The cycle time may be adjusted: short cycles yield smoother walls, and long cycles yield a higher etch rate.

Trenches 654 for embodiments of a backside inductor may be etched to a depth of 25-500 um for a silicon substrate that is approximately 750 um thick, for example. There may be a tradeoff in depth of the trench versus diameter of the coil and thickness of the substrate in order to maintain adequate bulk material for mechanical strength of the substrate.

Figure 6C:
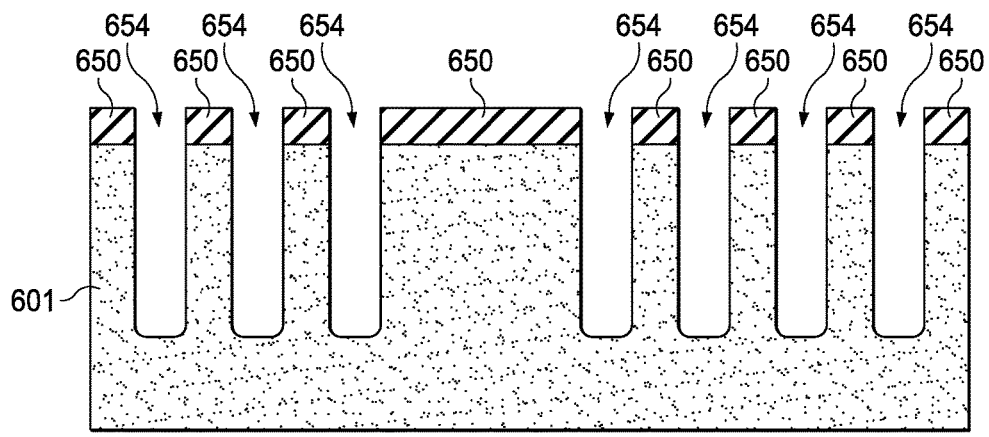

FIG. 6C illustrates substrate 601 after cleaning the wafer, stripping off photolithographic resist layer 652 and removing the passivation layer polymers used during formation of trenches 654.

Figure 6D:
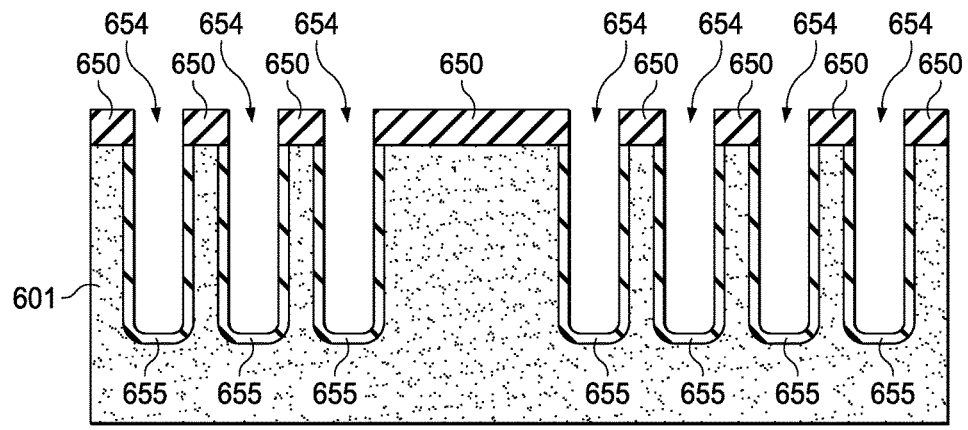

FIG. 6D illustrates substrate 601 after forming a dielectric surface isolation 655 on the inside of trench 654. Various compounds may be used to form dielectric surface isolation 655; such as: an atomic layer deposition (ALD) of Al2O3, silicon nitride, silicon dioxide, or other non-conductive dielectric materials.

Figure 6E:
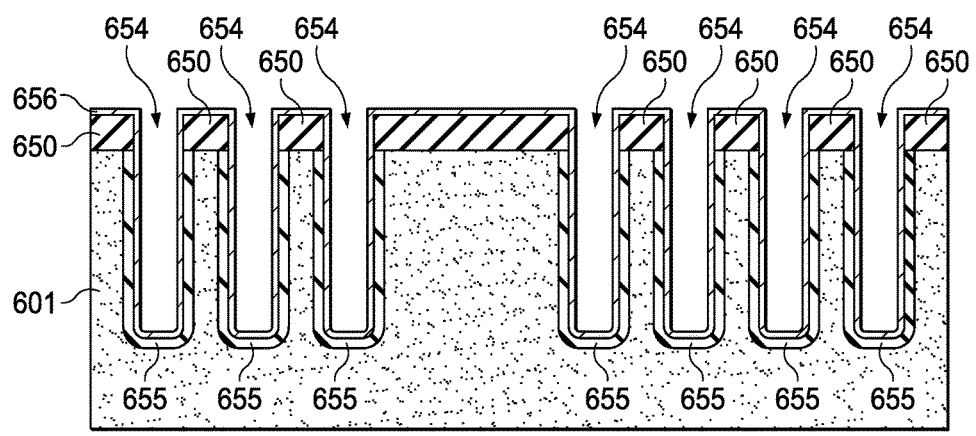

FIG. 6E illustrates substrate 601 after forming a metal seed layer 656 over the surface of the substrate 601 and trench 654. Metal seed layer 656 may be selected from various metallic compounds, such as: titanium nitride (TiN), titanium tungsten (TiW), etc. using a known or later developed process, such as atomic layer deposition, for example.

Figure 6F:
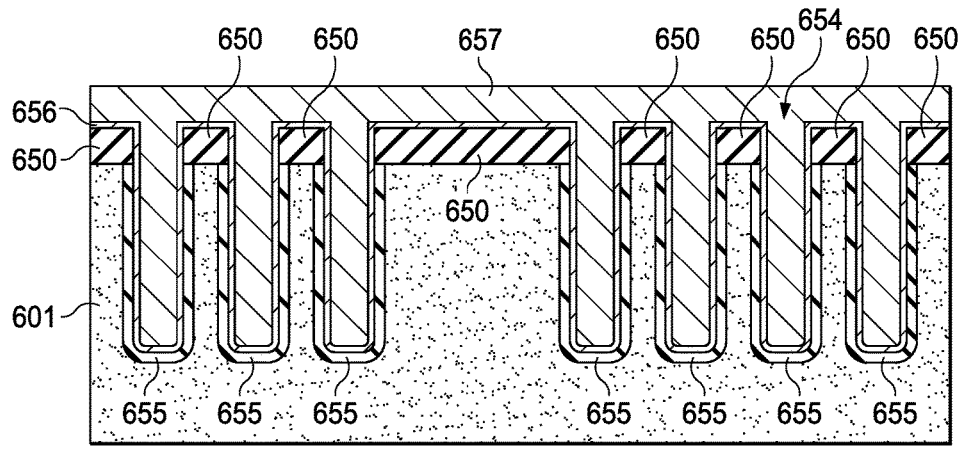

FIG. 6F illustrates substrate 601 after forming a copper fill layer 657 using a plating process in which the copper plating adheres to the metallic seed layer 656.

Figure 6G:
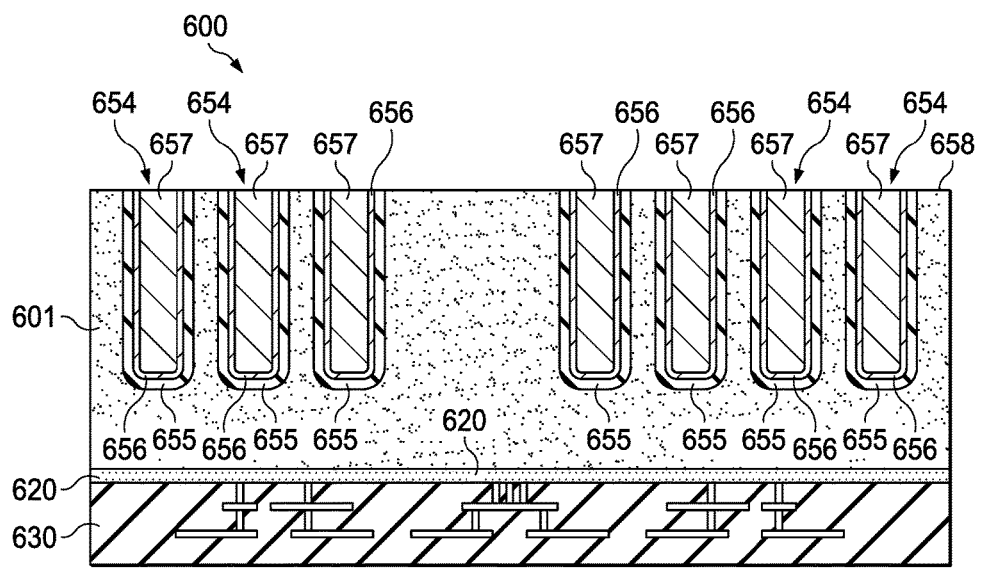

FIG. 6G illustrates a nearly complete IC 600 after a backside grind process is used to remove the surface portion of metal plate 657, along with mask layer 650 to form a smooth surface 658 on the backside of substrate 601.

An epi layer 620 that includes various transistors and interconnect layer 630 are also illustrated in this figure on the front side of substrate 601. As mentioned above, the active circuitry in epi layer 620 and interconnect layer 630 may be fabricated either before or after the backside inductor 654 is formed.

Connections between backside inductor and active circuitry in epi layer 620 may be completed in various manners, such as those illustrated in FIG. 3, 4, or 5, for example.

Figure 7A:
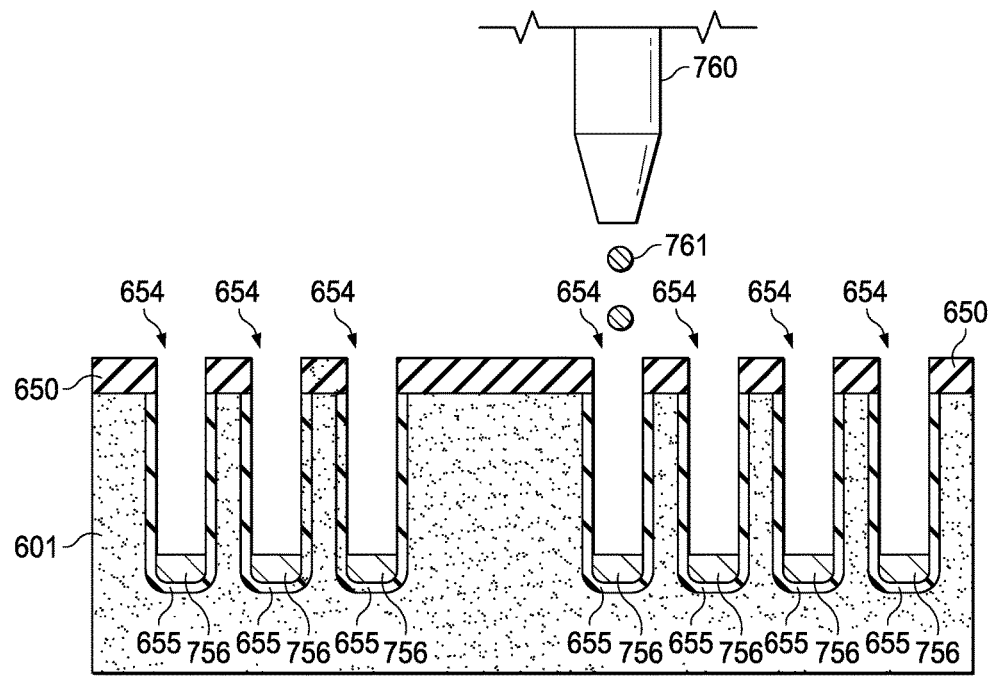
FIGS. 7A-7B illustrate an alternative embodiment in which a seed layer is deposited using a printer.

FIG. 7A illustrates an alternative embodiment in which a seed layer 756 is deposited using a printer in place of metallic seed layer 656 illustrated in FIG. 6E. FIG. 7A illustrates an inkjet printer 760 depositing a series of droplets 761 that contain metal nanoparticles into trench 654. Fabrication of three dimensional structures using ink jet printers or similar printers that can "print" various polymer materials is well known and need not be described in further detail herein. For example, see "3D printing," Wikipedia, Sep. 4, 2014. Printing allows for the rapid and low-cost deposition of thick dielectric and metallic layers, such as 100 um-1000 um thick, for example, while also allowing for fine feature sizes, such as 20 um feature sizes, for example.

The ink may include a solvent or several solvents to match rheology and surface tension, and metallic nanoparticles. The size of the nanoparticle may be in a range of 2-100 nm, for example. The ink may also include a dispersant such as polyvinylpyrrolidone (PVP) or be charge dispersed to prevent agglomeration of the particles. The ink may also include binders such as polymer epoxies, and other known or later developed ink additives.

The film residue that is left from the ink may then be cured in the case of solvent or dispersant based ink where solvent or dispersant is evaporated. Curing may be thermal (50-250 C or higher), UV, Infrared, Flash Lamp, or of another form that is compatible with the ink being used.

In this example, the metal nanoparticles that form seed layer 756 may be copper, TiN, or TiW, for example.

Figure 7B:
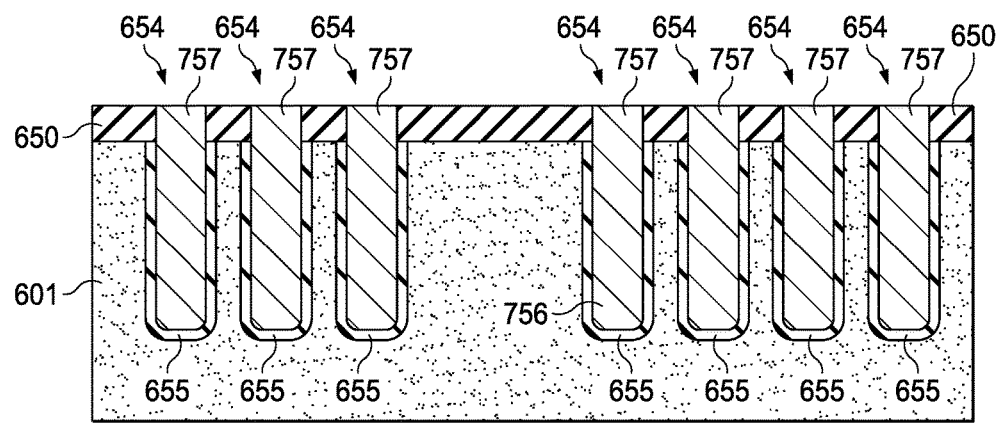

FIG. 7B illustrates substrate 701 after forming a copper fill layer 757 using a plating process in which the copper plating adheres to the metallic seed layer 756. In this example, since the plating process adheres only to the seed layer in the bottom of the trenches 654, no copper plating is deposited on the surface of substrate 601. Therefore, a backside grind process as illustrated in FIG. 6G is not required in this embodiment.

In another embodiment, the entire trench 654 may be filled with copper using an inkjet process.

Figure 8A:
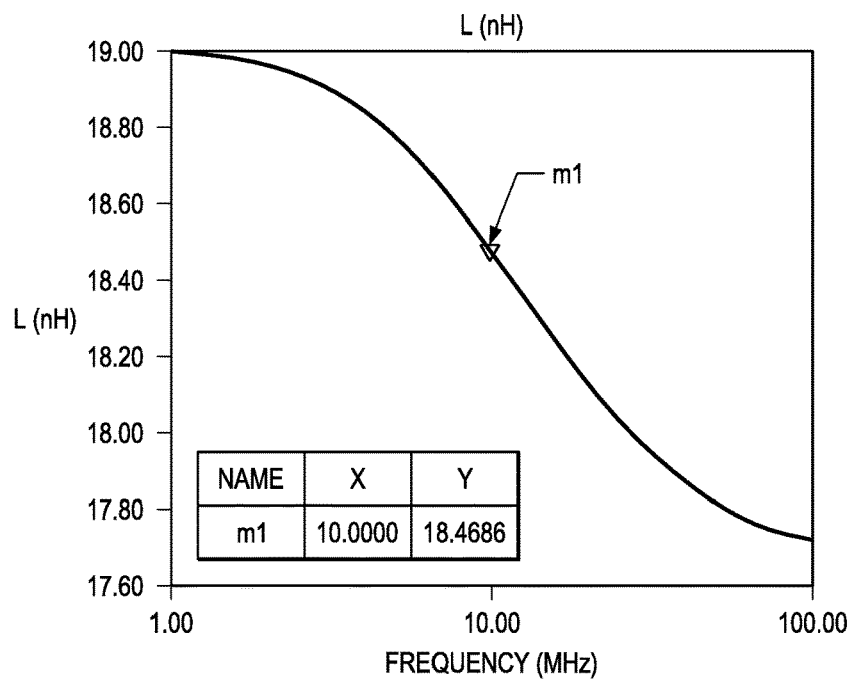
FIGS. 8A-8B illustrate simulation results or an exemplary backside inductor.
Figure 8B:
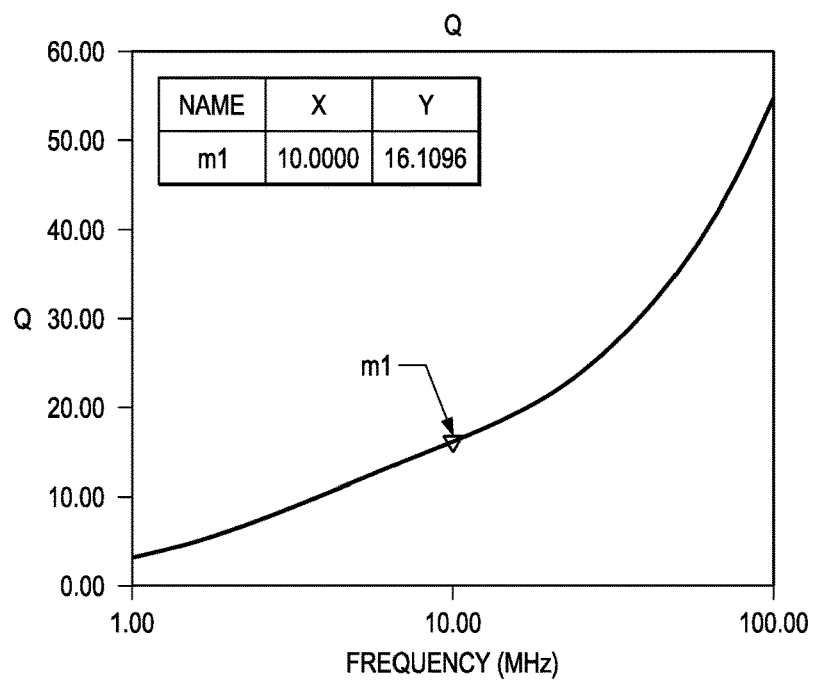

FIGS. 8A-8B illustrate simulation results for an exemplary backside inductor similar to those described above. In this simulation, the inductor has a diameter of 5 mm and has a spiral coil with two turns. The simulated trenches are 150 um deep and 70 um wide, with 150 um trench spacing. As illustrated in FIG. 8A, at 10 MHz the inductance is approximately 18 nH. As illustrated in FIG. 8B, at 10 MHz the Q is approximately 16. The DC resistance is approximately 36 mOhm.

FIGS. 8A-8B illustrate that the performance of the backside inductor is reasonably stable over a frequency range of 1-100 MHz.

Figure 9:
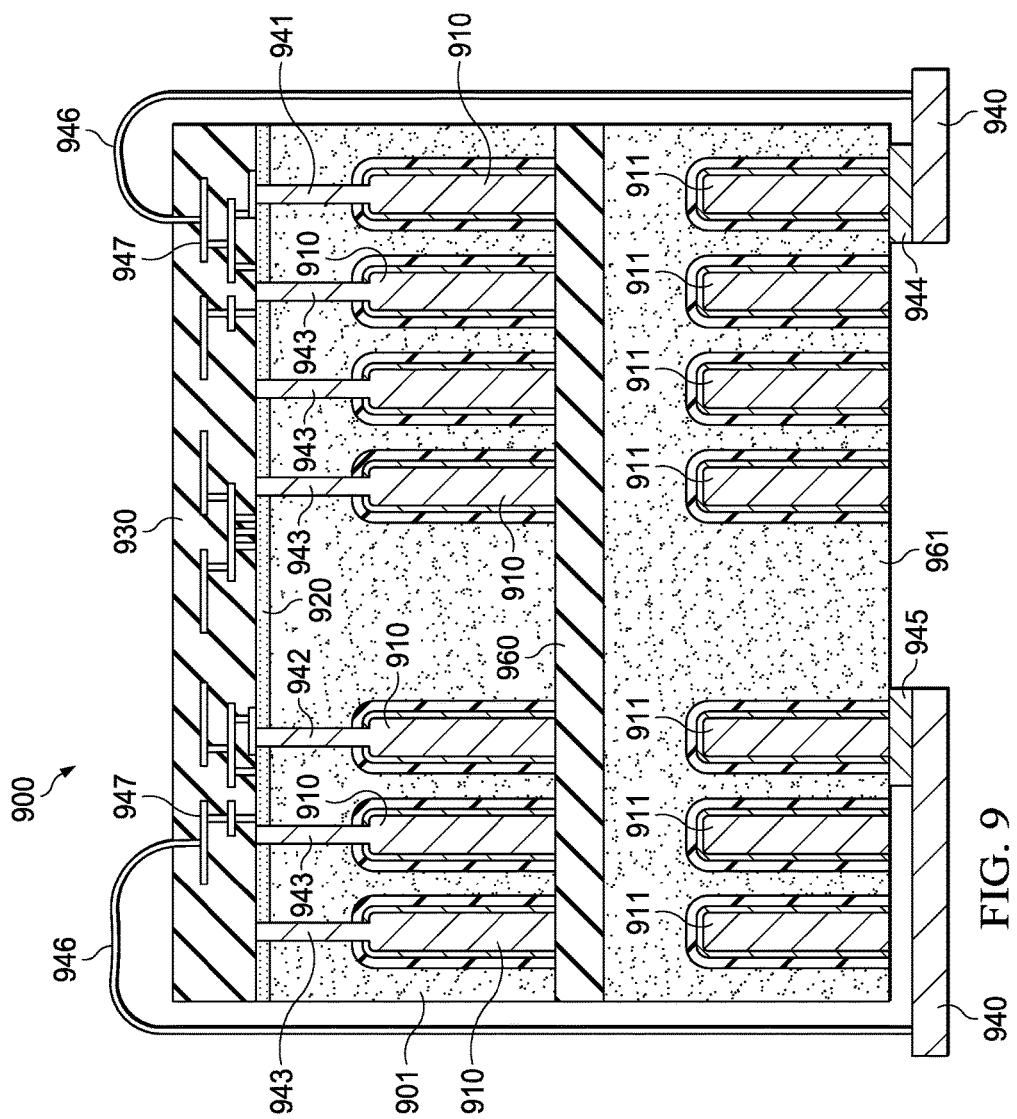
FIG. 9 illustrates another embodiment with inductors formed in multiple substrate layers.

FIG. 9 illustrates another embodiment of an IC 900 with inductors formed in multiple substrate layers. In this example, an inductor 910 may be fabricated in a first substrate layer 901 as described above and interconnected to active circuitry in epi layer 920 and interconnect layer 930 using TSVs, such as TSVs 941, 942. Additional connections may be made using one or more TSV 943, for example.

In this embodiment, a second wafer with substrate layer 961 may be bonded to the first substrate layer 901. An insulative layer 960, such as silicon dioxide may be formed on both wafers and then the two wafers may be stacked with the insulative layers together and bonded in a furnace to create a single wafer, for example.

A second inductor 911 may then be formed in the second substrate layer 961 as described above. The second inductor 911 may be coupled to lead frame or other substrate 940 via bumps 944, 945 and thereby to active circuitry in epi layer 920 using wire bonds 946 to pads 947, as described above with regard to FIG. 4, for example.

In another embodiment, IC 900 may be package as a flip chip as described with regard to FIG. 3, for example.

System Example

Figure 10:
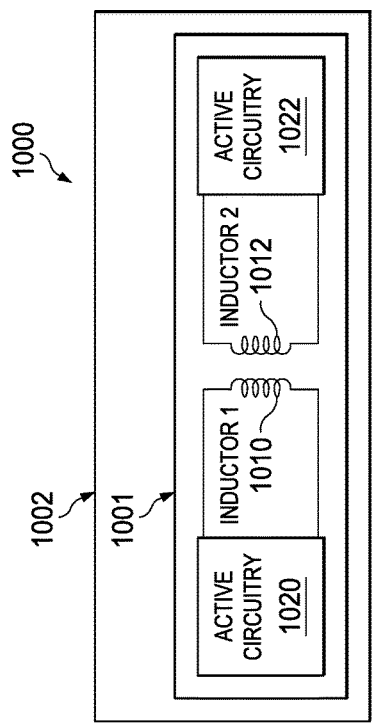
FIG. 10 is a block diagram of an exemplary system that includes an IC with a backside inductor.

FIG. 10 is a block diagram of an exemplary system 1000 that includes an IC 1001 with a backside inductor. In this example, active circuitry 1020 is coupled to inductor 1010 which is formed on the backside of IC 1001. Inductor 1010 may be coupled to active circuitry 1020 using any of the schemes described with regards to FIGS. 3-5, for example.

System 1000 may use inductor 1010 for various functions, such as: filter output voltage and current; store energy that is delivered cycle by cycle; provide an efficient way to move energy from two or more voltage domains; perform auxiliary functions such as providing adiabatic gate drivers and zero voltage transitions; etc.

In some embodiments, a second inductor 1012 may be included that is coupled to active circuitry 1022. Inductor 1012 may also be formed on the backside of IC 1001 as described in more detail above. Inductor 1012 may be coupled to active circuitry 1022 using any of the schemes described with regards to FIGS. 3-5, for example.

In this example, inductor 1010 is configured to inductively couple to inductor 1012. In another embodiment, only one of the inductors may be present, for example.

System 1000 may use both inductors 1010 and 1012 to provide transformer isolation, for example.

System 1000 may include additional ICs and other components mounted on a system substrate 1002 to provide a particular function using known or later developed techniques. System substrate 1002 may be a printed circuit board, for example.

Figure 11:
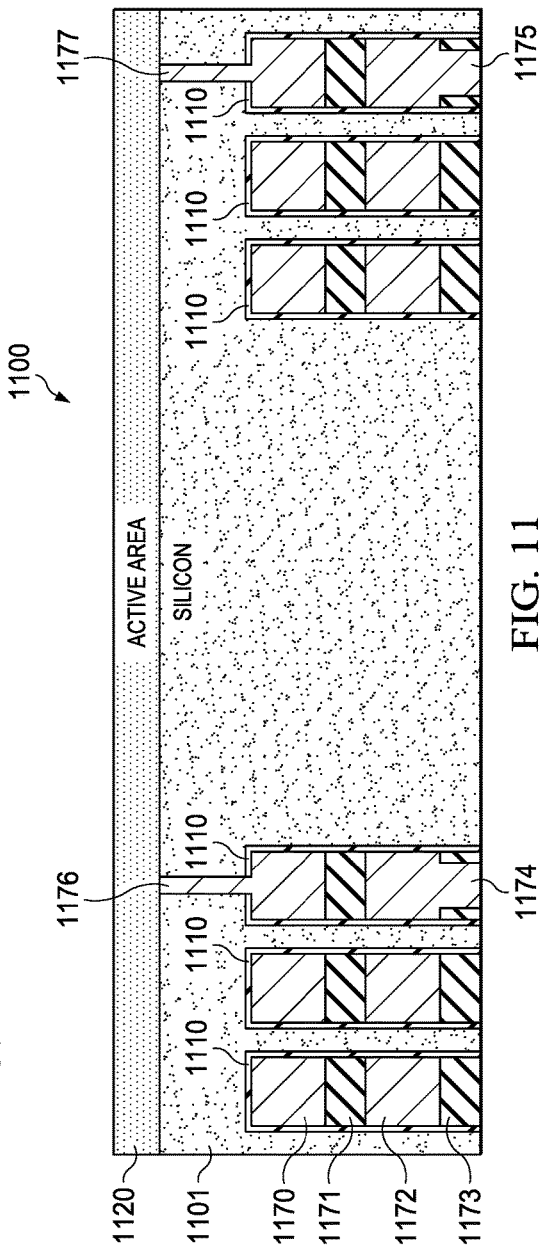
FIG. 11 is a block diagram of an exemplary system that includes an IC with a backside inductor created using multiple metallization layers.

FIG. 11 is a block diagram of an exemplary system that includes an IC 1100 with a backside inductor created in substrate 1101 using 3D printing that may produce multiple metallization layers 1170, 1172, for example. Active circuitry may be fabricated on the front side of substrate 1101 in an active layer 1120, as described in more detail above. In this example, a spiral trench 1110 may be fabricated as described in more detail above. A copper seed layer may then be 3D printed, as described in more detail with reference to FIG. 7A, seed layer 756. A copper fill layer 1170 may then be fabricated using a plating process, as described in more detail with reference to FIG. 7B, fill layer 757. In this example, fill layer 1170 may be stopped when trench 1110 is only partially filled.

An insulator layer 1171 may then be 3D printed within trench 1110 to cover and insulate copper fill layer 1170. Then, a second seed layer and fill layer 1172 may be fabricated in a similar manner. In this example, another insulator layer 1173 may be 3D printed within trench 1110 to cover and insulate copper fill layer 1172. Contact pads, such as pad 1174, 1175 may be provided by 3D printing a conductive column, for example. Alternatively, copper fill layer 1172 may extend to the surface of substrate 1101, similar to copper fill layer 757 in FIG. 7B.

Depending on a chosen thickness for each copper fill layer 1170, 1172 and the depth of trench 1110 in substrate 1101, two or more layers of inductive coils may be fabricated in this manner. In this example, two separate coils 1170 and 1172 are illustrated. Silicon substrate 1101 may be approximately 300 um thick, while each copper fill layer 1170, 1172 is approximately 100 um thick, for example. TSV 1176, 1177 may be provided to connect a lower coil 1170 to active circuitry in layer 1120 as described in more detail with reference to FIG. 5, while bond wires, bond clips, etc may be used to couple coil 1172 to active circuitry in layer 1120 as described in more detail with reference to FIGS. 3, 4. In this example, the inductive structure 1170, 1172 has a radius of approximately 1 mm and is coupled to switching circuitry in active layer 1120 that switches at a frequency of approximately 5 MHz, for example.

In another embodiment, a coil formed by copper fill layer 1170 may be connected in series with a coil formed in copper fill layer 1172 to form a single coil by 3D printing a contact between the two coils, for example.

Other Embodiments

While the invention has been described with reference to illustrative embodiments, this description is not intended to be construed in a limiting sense. Various other embodiments of the invention will be apparent to persons skilled in the art upon reference to this description. For example, while embodiments of backside inductors formed in a silicon substrate have been described herein, other embodiments of one or more inductors formed on the backside of a semiconductor substrate and interconnected with active circuitry on a front side of the semiconductor substrate may be implemented using other types of semiconductor substrates, such as Germanium, Carbon, Antimony, Gallium Arsenide, Gallium Nitride, etc. In another embodiment, a non-semiconductor substrate such as glass or sapphire may be used, for example.

In another embodiment, the IC may be based on a "silicon on insulator" technology and the backside inductor may be formed in the insulator layer if a bulk insulator is used. For example, the insulator may be sapphire in a "silicon on sapphire" technology. In this case, one or more backside inductors may be formed in the sapphire substrate. For a silicon-insulator-silicon technology, one or more backside inductors may be formed in the bulk silicon portion of the substrate.

While copper was disclosed herein for forming the conductive coils of a backside inductor, other conductive metals, compounds, or polymers may be used to form the coils, such as: silver, gold, tin, carbon, graphite, polysilicon, etc.

While a plating process for forming the coils is disclosed herein, other embodiments may form the coils using a spun on slurry to fill the trenches, for example. Other known or later developed techniques for metal deposition may be used to fill the trenches.

While a thick epi layer in which the circuit transistors are formed is described herein, other embodiments may use a thin epi layer, or no epi layer, depending on the semiconductor process being used to form the active circuitry. In any case, as use herein, the term "active circuitry located on the front side surface" refers circuitry that may or may not be formed in an epi layer. It also refers to circuitry that may be covered by one or more interconnect layers and by one or more additional protective layers, for example.

While a circular spiral trench is described herein, other embodiments may use other configurations for the backside coils, such as: oval, square/rectangular, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection. Of course, where the term "couple" is used in reference to coupling two coils, that usage refers to electromagnetic coupling.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An integrated circuit (IC) comprising:
    a circuit substrate having a front side and an opposite back side;
    active circuitry located on the front side; and
    an inductive structure embedded within a deep trench formed in the circuit substrate on the back side; and
    a package substrate, in which the circuit substrate is mounted on the package substrate such that contact pads of the active circuitry are bump bonded to leads on the package substrate;
    the inductive structure being connected to the active circuitry via wire bonds from the leads to contact points on the inductive structure.

2. The IC of claim 1, further including multiple inductive structures embedded in the circuit substrate on the back side configured to inductively couple to each other.

3. The IC of claim 1, in which the deep trench has a depth in the range of approximately 25-500 um.

4. The IC of claim 1, in which the deep trench is at least four times as deep as it is wide.

5. The IC of claim 2, in which the circuit substrate includes a first substrate layer and a second substrate layer separated by an insulating layer, in which a first one of the multiple inductive structures is formed in the first substrate layer and in which a second one of the multiple inductive structures is formed in the second substrate layer.

6. The IC of claim 1, in which the circuit substrate is a silicon-on-insulator substrate, in which the trench is formed in an insulator portion of the circuit substrate.

7. The IC of claim 1, in which the package substrate is a lead frame.

8. A system comprising:
    a system substrate; and
    an integrated circuit (IC) mounted on the system substrate, in which the IC includes:
        a circuit substrate having a front side surface and an opposite back side surface;
        active circuitry located on the front side surface such that contact pads of the active circuitry are bump bonded to leads on the system substrate; and
        an inductive structure located within a deep trench formed in the circuit substrate below the backside surface, in which the inductive structure is coupled to the active circuitry via wire bonds from the leads to contact points on the inductive structure.

9. A method of making an integrated circuit having an integrated inductive component, the method comprising:
    fabricating active circuitry on a front side of a circuit substrate of the integrated circuit (IC);
    mounting the circuit substrate on a package substrate such that contact pads of the active circuitry are bump bonded to leads on the package substrate;
    etching a deep trench into a back side of the circuit substrate;
    filling the trench with an electrically conductive material to form a coil; and
    coupling the coil to the active circuitry via wire bonds from the leads to contact points on the coil.

10. The method of claim 9, in which etching a deep trench forms multiple deep trenches for multiple coils configured to inductively couple to each other.

11. The method of claim 9, further including forming through silicon vias (TSV) to couple the coil to the active circuitry.

12. The method of claim 9, in which the deep trench is etched to a depth within a range of approximately 25-500 um.

13. The method of claim 10, in which the circuit substrate includes a first substrate layer and a second substrate layer separated by an insulating layer, in which a first one of the multiple coils is formed in the first substrate layer; and further including:
- etching a second deep trench into the second substrate layer;
- filling the second trench with an electrically conductive material to form a second coil; and
- coupling the second coil to the active circuitry.

14. The method of claim 9, in which the circuit substrate is a silicon-on-insulator substrate, in which the trench is etched in an insulator portion of the circuit substrate.

\* \* \* \* \*